(12) United States Patent
Yacoub

(10) Patent No.: US 6,224,399 B1
(45) Date of Patent: *May 1, 2001

(54) SURFACE-MOUNT ELECTRICAL CONNECTION DEVICE

(75) Inventor: Patrick Yacoub, St. Lazarre (CA)

(73) Assignee: Weco Electrical Connectors Inc., Baie d'Urfe (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/313,540

(22) Filed: May 14, 1999

(51) Int. Cl.$^7$ ............................................ H01R 1/00
(52) U.S. Cl. ............................................ 439/83; 439/876
(58) Field of Search ............................ 439/83, 874, 876, 439/973, 590; 29/739

(56) References Cited

U.S. PATENT DOCUMENTS

| | | | | |
|---|---|---|---|---|
| 4,475,284 | * | 10/1984 | Jonson | 29/739 |
| 4,678,250 | | 7/1987 | Romine et al. | 439/83 |
| 4,927,372 | * | 5/1990 | Collier | 439/83 |
| 5,373,626 | * | 12/1994 | Youngfleish | 29/739 |
| 5,706,952 | * | 1/1998 | Bianca et al. | 206/713 |
| 5,749,458 | * | 5/1998 | Bianca et al. | 200/541 |
| 5,957,739 | * | 9/1999 | Bianca et al. | 439/876 |

FOREIGN PATENT DOCUMENTS

| | | | | |
|---|---|---|---|---|
| 198 13 932 A1 | 3/1995 | (DE) | | H05K/3/30 |
| 9419334 | 3/1995 | (DE) | | H05K/3/30 |

OTHER PUBLICATIONS

English Translation of DE 198 13 932 A1, Mar. 1995.

* cited by examiner

Primary Examiner—Tulsidas Patel
(74) Attorney, Agent, or Firm—Schweitzer Cornman Gross & Bondell LLP

(57) ABSTRACT

A novel electrical connection device for surface-mounting on a circuit board. The electrical connection device includes at least two terminal members. Each terminal member includes a retaining surface serving as a point of electrical contact between the terminal member and the circuit board and as a point of solder-anchoring for securely mounting the electrical connection device to the PCB. Further, each terminal member includes a contact portion providing for the mounting of an electrical component onto the circuit board, as well as serving as a point of electrical contact between the circuit board and the electrical component. The terminal members are mounted on a strip of insulating material that holds them in the proper spacial relationship until they have been secured to the circuit board. The strip reduces pin-misalignment that can cause difficulties in engaging a mating electrical component on the electrical connection device. Optionally, the strip can be removed from the pins once the pins are fixed on the circuit board.

8 Claims, 3 Drawing Sheets

SURFACE-MOUNT ELECTRICAL CONNECTION DEVICE

FIELD OF THE INVENTION

The present invention relates to the field of electrical connectors, particularly connectors capable of being surface-mounted to a PCB (Printed Circuit Board). More specifically, the invention relates to an electrical connection device including a plurality of terminal members held in a predetermined spacial relationship that can be surface-mounted to a PCB. The invention also extends to a method for mounting an electrical connection device on a circuit board and to a circuit board including such electrical connection device.

BACKGROUND OF THE INVENTION

With the advancement of circuit board assembly has come a technique known as surface-mount technology, which consists in the mounting of electronic circuit components and their electrical connections on the surface (through solder-anchoring) of a Printed Circuit Board (PCB), rather than through holes (also called "vias"). The PCB itself is a flat board whose front contains slots for integrated circuit chips and connections for a variety of electrical components, and whose back is printed with electrically conductive pathways between the components. An example of such an electrical component is the electrical connector which, when mounted on the PCB, creates an interface between discrete wires and the PCB. Automation of the circuit board assembly process typically involves the use of automated pick-and-place machinery for placement of the electrical components onto the PCB.

Existing de-plugable type electrical connections are usually created on the PCB in the form of surface-mount pins. These pins are built and sold separately, each individually surface-mounted onto the PCB by the pick-and-place machinery.

Unfortunately, dune to the individual mounting of these surface-mount pins, the accuracy of the distance between each pin on the PCB depends entirely on the accuracy of the pick-and-place machine. If the pins are not precisely positioned with relation to one another on the PCB, it may be difficult, even impossible, for the mating electrical component to engage the pins of the electrical connection.

The background information herein clearly shows that there exists a need in the industry to provide an improved electrical connection device for a circuit board.

SUMMARY OF ME INVENTION

The present invention provides an electrical connection device for receiving a mating electrical component. The electrical connection device includes a body and at least two elongated terminal members mated to the body. Each terminal member includes a retaining surface for establishing an electrical contact with a circuit board, where this retaining surface is capable of being solder-anchored to the circuit board for fixing the terminal member on the circuit board. The retaining surfaces of all of the terminal members are coplanar with each other. Each terminal member further includes a contact portion for engaging a mating electrical terminal member of the mating electrical component when the mating electrical component is mounted to the electrical connection device. The contact portions of all of the terminal members are substantially parallel with one another. The body of the electrical connection device is operative to maintain the terminal members in a predetermined spatial relationship, and is removable from the terminal members once the retaining surfaces of the terminal members have been solder-anchored to the circuit board.

The electrical connection device provides for an accurate inter-terminal member spacing once solder-anchored to the circuit board. Further, an electrical connection device including multiple terminal members may be placed on the circuit board in a single step. Thus, the automation of the surface-mount assembly operation is greatly simplified.

BRIEF DESCRIPTION OF THE DRAWINGS

These and other features of the present invention will become apparent from the following detailed description considered in connection with the accompanying drawings. It is to be understood, however, that the drawings are provided for purposes of illustration only and not as a definition of the boundaries of the invention, for which reference should be made to the appending claims.

DESCRIPTION OF THE PREFERRED EMBODIMENT

Figure 1:
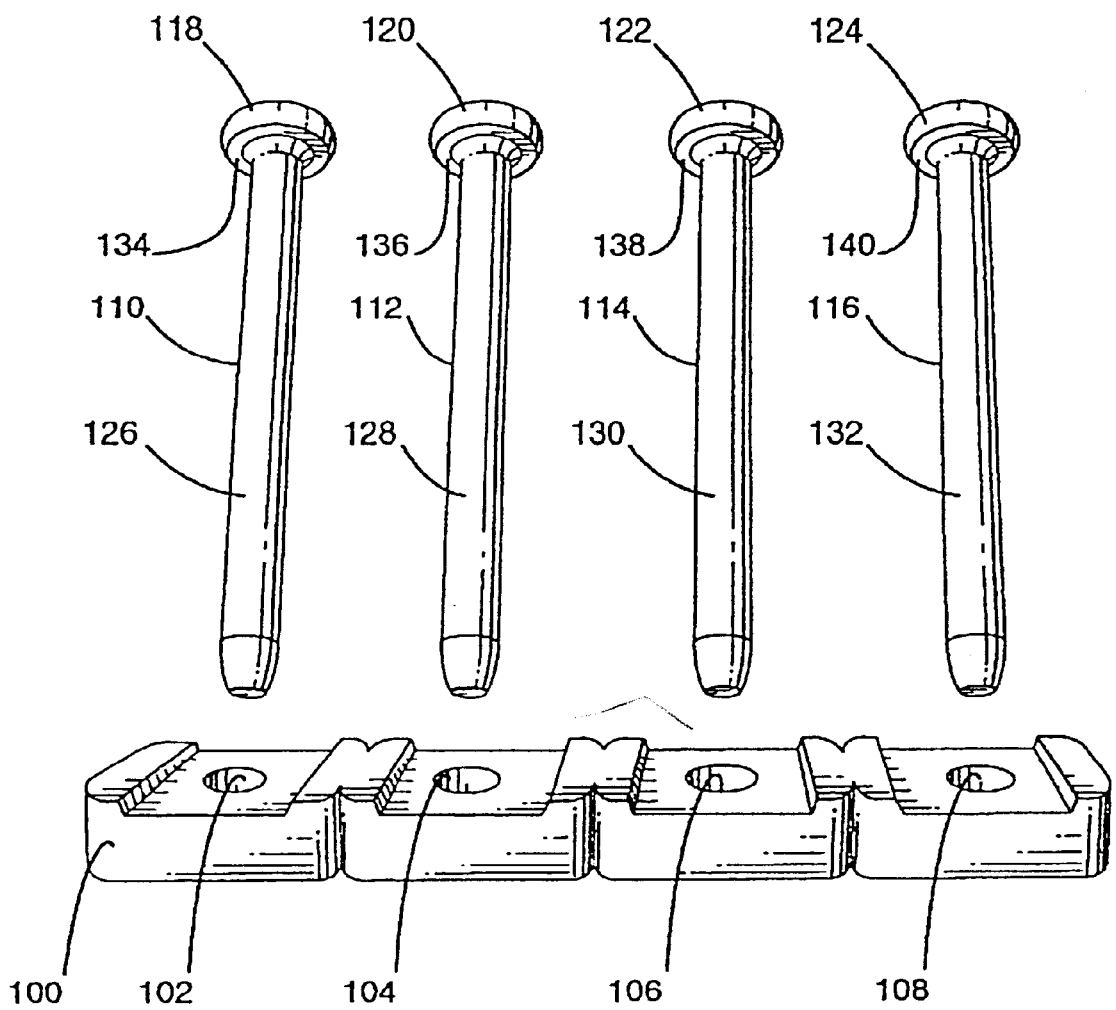
FIG. 1 is a perspective exploded view of a surface-mount, electrical connection device, in accordance with an embodiment of the present invention.

In a most preferred embodiment, the electrical connection device to be surface-mounted on a PCl is as shown in FIG. 1. The body 100 of the electrical connection device is a strip of insulating material, stir-h as plastic, and is molded to include a plurality of Apertures. Specific to this example, the body 100 (also referred to as molded strip) includes apertures 102, 104, 106 and 108. The electrical connection device further includes terminal members 110, 112, 114 an d 116, themselves including end surfaces 118, 120, 122 and 124, respectively, and contact portions 126, 128, 130 and 132, respectively. Specific to this example, terminal members 110, 112, 114 and 116 are male contact pins. The end surfaces, hereinafter referred to as rotaining surfaces, serve as points of both solder-anchoring and electrical contact between the electrical connection device an d the PCB, and will be described from a functional point of view in further detail below. The contact portions serve as points of electrical contact between the PCB and an electrical component, such as a mating de-plugable electrical connector, as well as provide for the removable mounting of a de-plugable electrical component to the so PCB. This latter functionality of the contact portions will also be described in further detail below.

Each pin includes a head having a radially outwardly projecting shoulder, where this head forms, at least in part, a flange-shaped retaining surface. The contact portion extends from the head, in a direction normal to the radial plane of the head. The contact portion of the pin is cylindrical, with a constant diameter along most of its length. Apertures 102, 104, 106 and 108 are matched in diameter to the diameter of the plug portions 126, 128, 130 and 132, for ensuring a tight friction fit of the pins 110, 112, 114 and 116 in the molded strip 100.

Figure 2:
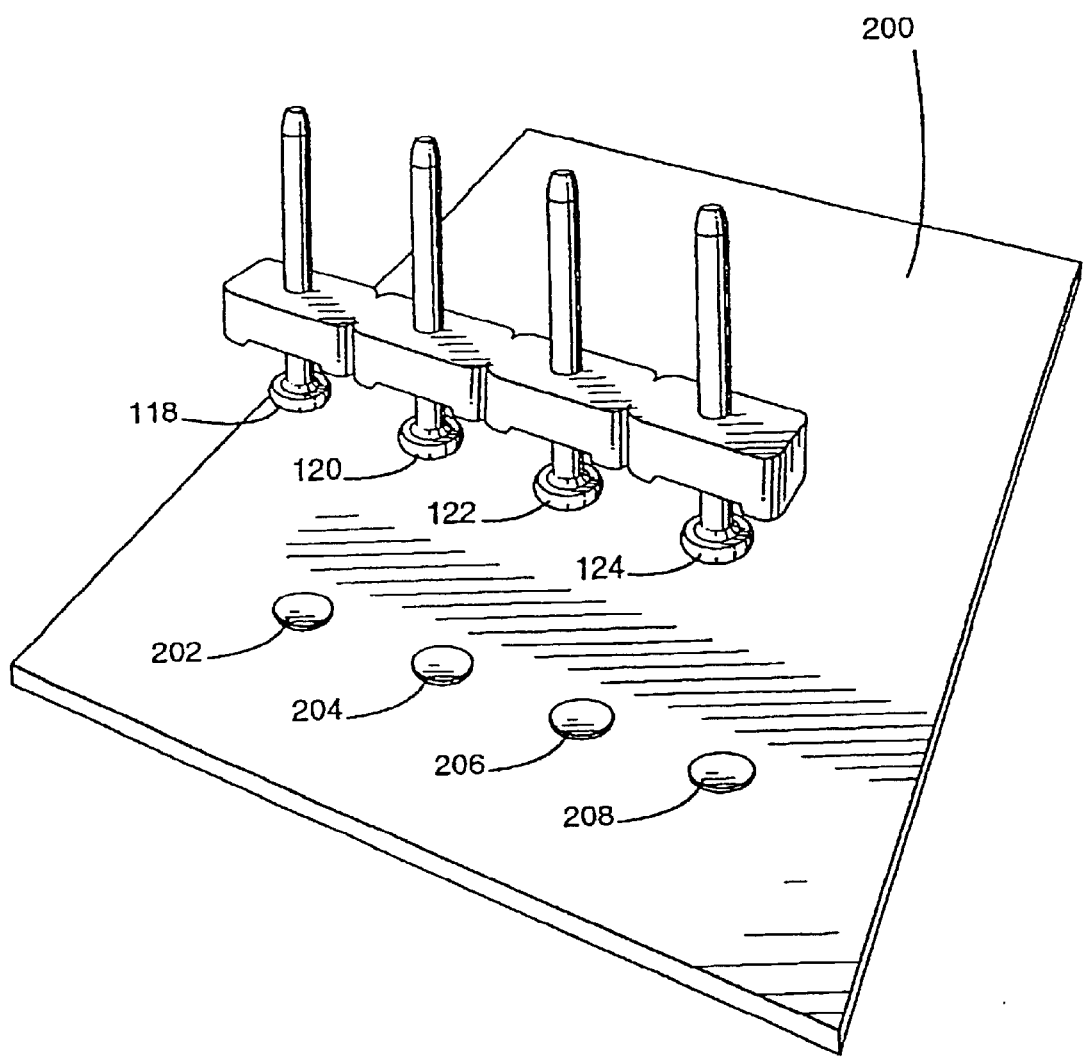
FIG. 2 is an assembled view of the surface-mount, electrical connection device shown in FIG. 1, shown in position to be mounted on a PCB.

FIG. 2 illustrates the assembled electrical connection device, ready for surface-mounting to a PCB 200. The PCB 200 may include multiple integrated circuit chips and connections for a variety of other electrical components, none of which are shown in FIG. 2 in the interest of clarity. The PCB 200 further includes a plurality of solder pads for securely mounting the electrical connection device to the PCB 200. Solder pads 202, 204, 206 and 208 are matched in size, shape and spacing with retaining surfaces 118, 120, 122 and 124, respectively, and serve as points of both electrical contact and anchoring between the electrical connection device and the PCB 200, once soldered with the pins.

Figure 3:
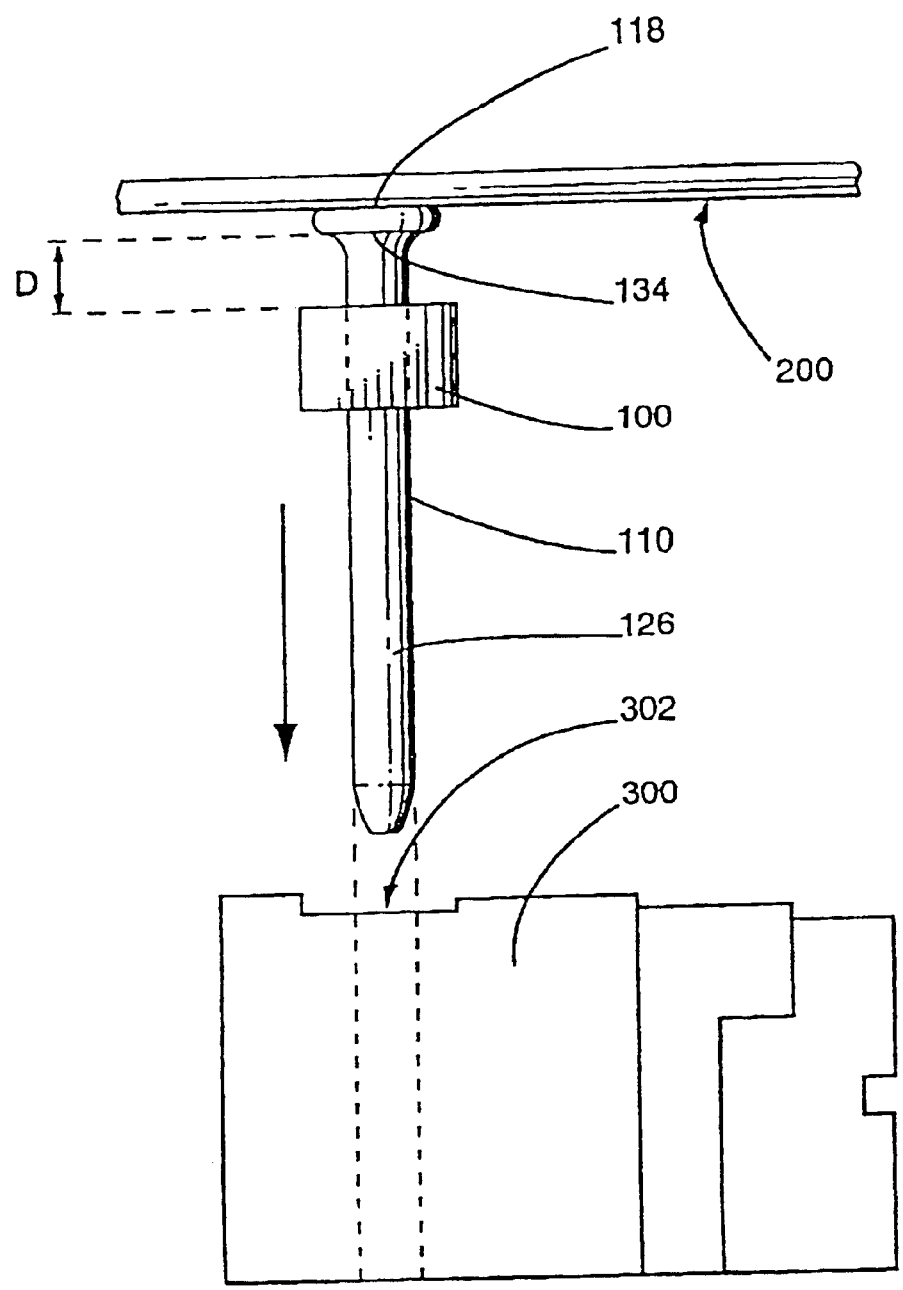
FIG. 3 is a side-view of the surface-mounted electrical connection device shown in FIG. 2, shown in position to connect to a de-plugable electrical connector.

In FIG. 3, the surface-mounted electrical connection device is in position for engaging a mating de-plugable electrical connector 300 to the PCB 200. Seen from the side, pin 110 is positionally matched to a mating terminal member of the connector 300, specifically aperture 302. Although not shown in FIG. 3, the connector 300 also includes three other apertures for receiving pins 112, 114 and 116. The circular cross-section diameter of the cylindrical pins 110, 112, 114 and 116 is such that the pins fit tightly into the connector 300 apertures. The apertures include contact members that touch the pins when the electrical connection device is mated to the connector 300. In turn, those contact members may lead to wires (not shown in the drawings).

In use, the molded strip 100 is fitted with the pins 110, 112, 114 and 116, whereby contact portions 126, 128, 130 and 132 are pressed into apertures 102, 104, 106 and 108, respectively, of the molded strip 100. The dimension matching between pins and apertures ensures that once the pins are fitted into the apertures, they are tightly retained in place by friction forces. The pins are fitted into the apertures of the molded strip 100 such that the clearance distance D (shown in FIG. 3) between the lower edges 134, 136, 138 and 140 of the retaining surfaces 118, 120, 122 and 124 and the molded strip 100 is substantially the same for all four pins. This ensures that the retaining surfaces are all co-planar, necessary for an even soldering between the connection device and the PCB 200. The clearance distance D facilitates soldering of the electrical connection device to the PCB 200.

The assembled electrical connection device is next placed on the PCB 200, positioned such that the retaining surfaces 118, 120, 122 and 124 are aligned with solder pads 202, 204, 206 and 208, respectively. The placement of the electrical connection device, including all four pins, onto the PCB 200 may be performed in a single step by pick-and-place machinery in an automated assembly operation. This is an important advantage over existing surface-mount, deplugable type connections, where separate pins are individually placed and surface-mounted onto the PCB, requiring multiple steps.

In an alternative embodiment of the present invention, the electrical connection device may include a pick-and-place pad for easing the assembly of the electrical connection device to the PCB 200 as performed by the pick-and-place machinery. In a specific example, this pad may take the form of a second molded strip installed on all or a subset of the pins (at the opposite end from the retaining surfaces), for increasing the surface area available to the pick-and-place machinery for picking up the electrical connection device. Once the device is mounted on the PCB 200, the pick-and-place pad may be removed.

Once properly placed on the PCB 200, the electrical connection device retaining surfaces 118, 120, 122 and 124 are soldered to the PCB 200. The retaining surfaces 118, 120, 122 and 124 of the pins are thin enough to allow for quick heating to soldering temperatures. As such a characteristic is common to typical solder contacts and is well known to those skilled in the art, it will not be described in further detail. Since all retaining surfaces are co-planar, an even soldering between the electrical connection device and the PCB 200 is assured. The molded strip 100 ensures an accurate spacing between pins 102, 104, 106 and 108, such that no discrepancies arise between the inter-pin spacing on the electrical connection device and the inter-solder pad spacing on the PCB 200. This feature also insures that once soldered, the pins of the electrical connection device will precisely mate with the apertures of the electrical connector 300. Note that once the electrical connection device has been secured (soldered) to the PCD 200, the molded strip 100 can be removed by pulling it off of the pins. This will allow the connector 300 to lay flush against the PCB 200 once it is mated to the pins of the electrical connection device, as required by certain low profile electrical components.

The surface-mounted connection device may now be used to removably mount a de-plugable electrical component to the PCB 200. As shown in FIG. 3, a de-plugable connector 300 is positioned such that its apertures are aligned with the contact portions 126, 128, 130 and 132 of pins 102, 104, 106 and 108. An external force applied to the de-plugable connector 300 can push the connector 300 onto the PCB 200 such that the contact portions 126, 128, 130 and 132 of the surface-mounted connection device tightly plug the connector 300 apertures. When the connector 300 is to be serviced outside of the PCS 200, it may be pulled off of the PCS 200, the connector 300 apertures gradually releasing the electrical connection device pins 102, 104, 106 and 108.

The above description of a preferred embodiment under the present invention should not be read in a limitative manner as refinements and variations are possible without departing from the spirit of the invention. The scope of the invention is defined in the appended claims and their equivalents.

I claim:
1. In combination:
an electrical component;
an electrical connection device for matingly receiving said electrical component, said electrical connection device comprising
a) a body;
b) at least two elongated terminal members mated to said body, each terminal member including:
i) a retaining surface for establishing an electrical contact with a circuit board, said retaining surface capable of being solder-anchored to the circuit board for fixing said terminal member on the circuit board, the retaining surfaces of the terminal members being coplanar;
ii) a contact portion for engaging a mating electrical terminal member of the electrical component when the electrical component is mounted to the electrical connection device, the contact portions of the terminal members being substantially parallel with one another;
c) said body maintaining the terminal members in a predetermined spatial relationship during mounting and fixing of said electrical connecting device to the circuit board, said body being removable from the terminal members once the retaining surfaces of the terminal members have been solder-anchored to the circuit board whereby, when the electrical component is mounted to said electrical connection device, a surface of the electrical component is substantially flush with the retaining surfaces of the terminal members.

2. An electrical connection device as defined in claim 1, therein each terminal member has a longitudinal axis and includes a flange-shaped head extending in a direction generally transverse to said longitudinal axis, said head having a transverse dimension exceeding a transverse dimension of said contact portion, said head forming at least a part of the retaining surface.

3. An electrical connection device as defined in claim 1, wherein said boded is made of an electrically insulating material.

4. An electrical connection device as defined in claim 1, wherein each of said terminal members is removably mounted to said body.

5. An electrical connection device as defined in claim 4, wherein said body includes a plurality of apertures, each one of said terminal members being mounted into a respective aperture in said body.

6. An electrical connection device as defined in claim 5, wherein each one of said terminal members is frictionally secured in said respective aperture.

7. A method for mounting an electrical connection device on a circuit board, said electrical connection device operative to receive a mating electrical component, said electrical connection device comprising:

a body;
   at least two elongated terminal members mated to said body, each terminal member including;
      a) a retaining surface for establishing an electrical contact with the circuit board, said retaining surface capable of being solder-anchored to the circuit board for fixing the terminal member on the circuit board, the retaining surfaces of the terminal members being coplanar;
      b) a contact portion for engaging a mating electrical terminal member of the electrical component when the electrical component is mounted to the electrical connection device, the contact portions of the terminal members being substantially parallel with one another;
   said body maintaining said terminal members in a predetermined spatial relationship during mounting and fixing of the electrical connection device to the circuit board;
   said method comprising the steps of:
      i) positioning the electrical connection device on the circuit board such that the retaining surfaces of said terminal members are aligned with solder pads on the circuit board,
      ii) soldering said retaining surfaces to the circuit board;
      iii) removing said body from said terminal members once the retaining surfaces of said terminal members have been solder-anchored to the circuit board whereby, when the electrical component is mounted to the electrical connection device, a surface of the electrical component is substantially flush with the retaining surfaces of the terminal members.

8. A circuit board assembly comprising:

a substrate layer;

a plurality of contact pads mounted to said substrate layer;

an electrical component;

an electrical connection device for matingly receiving the electrical component, said electrical connection device comprising:
   a) a body;
   b) at least two elongated terminal members mated to said body, each terminal member including:
      i) a retaining surface for establishing an electrical contact with the circuit board, said retaining surface capable of being solder-anchored to one of said contact pads for fixing the terminal member on the circuit board, the retaining surfaces of the terminal members being coplanar;
      ii) a contact portion for engaging a mating electrical terminal member of the electrical component when the electrical component is mounted to the electrical connection device, the contact portions of the terminal members being substantially parallel with one another;
   c) said body maintaining said terminal members in a predetermined spatial relationship during mounting and fixing of said electrical connection device to the circuit board, said body being removable from said terminal members once the retaining surfaces of said terminal members haste been solder-anchored to the circuit board whereby, when the electrical component is mounted to the electrical connection device, a surface of the electrical component is substantially flush with the retaining surfaces of the terminal members.

\* \* \* \* \*